(12) United States Patent
Wu et al.

(10) Patent No.: US 11,877,440 B2
(45) Date of Patent: Jan. 16, 2024

(54) BIT LINE STRUCTURE INCLUDING OHMIC CONTACT AND FORMING METHOD THEREOF

(71) Applicant: CHANGXIN MEMORY TECHNOLOGIES, INC., Hefei (CN)

(72) Inventors: Gongyi Wu, Hefei (CN); Yong Lu, Hefei (CN); Penghui Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 198 days.

(21) Appl. No.: 17/460,443

(22) Filed: Aug. 30, 2021

(65) Prior Publication Data
US 2022/0122989 A1  Apr. 21, 2022

Related U.S. Application Data

(63) Continuation of application No. PCT/CN2021/101424, filed on Jun. 22, 2021.

(30) Foreign Application Priority Data

Oct. 15, 2020  (CN) .......................... 202011101808.0

(51) Int. Cl.
*H10B 12/00* (2023.01)

(52) U.S. Cl.
CPC ......... *H10B 12/482* (2023.02); *H10B 12/053* (2023.02); *H10B 12/34* (2023.02)

(58) Field of Classification Search
CPC ..... H10B 12/053; H10B 12/34; H10B 12/482

USPC ......................................................... 257/908
See application file for complete search history.

(56) References Cited

U.S. PATENT DOCUMENTS

| | | |
|---|---|---|
| 6,455,886 B1 | 9/2002 | Mandelman |
| 6,541,810 B2 | 4/2003 | Divakaruni |
| 7,176,088 B2 | 2/2007 | Kakoschke |
| 7,291,881 B2 | 11/2007 | Kakoschke |
| 8,236,652 B2 | 8/2012 | Kim |
| 8,350,323 B2 | 1/2013 | Mikasa |
| 8,367,499 B2 | 2/2013 | Park |
| 8,912,604 B2 | 12/2014 | Myung et al. |
| 2006/0043420 A1 | 3/2006 | Kakoschke |
| 2007/0049050 A1 | 3/2007 | Kakoschke |
| 2011/0127605 A1 | 6/2011 | Kim |
| 2011/0233662 A1 | 9/2011 | Mikasa |

(Continued)

FOREIGN PATENT DOCUMENTS

| | | |
|---|---|---|
| CN | 101197375 A | 6/2008 |
| CN | 100530657 C | 8/2009 |

(Continued)

*Primary Examiner* — Hoai V Pham
(74) *Attorney, Agent, or Firm* — Cooper Legal Group, LLC

(57) ABSTRACT

The disclosure relates to a buried bit line and a forming method thereof, the buried bit line is formed in a bit line slot of a substrate, the buried bit line includes a first bit line layer formed in the bit line slot, a first blocking layer and a second bit line layer. A top of the first bit line layer is lower than a surface of the substrate. The first blocking layer is at least partially formed between the first bit line layer and an inner wall of the bit line slot. The second bit line layer is formed in the bit line slot and configured to communicate the first bit line layer with a drain region in the substrate.

6 Claims, 12 Drawing Sheets

(56) References Cited

U.S. PATENT DOCUMENTS

| | | | |
|---|---|---|---|
| 2011/0304028 A1* | 12/2011 | Kim | H10B 12/482 |
| | | | 257/E21.585 |
| 2012/0007171 A1* | 1/2012 | Kim | H10B 12/053 |
| | | | 438/270 |
| 2012/0018799 A1 | 1/2012 | Park | |
| 2014/0061745 A1 | 3/2014 | Myung et al. | |

FOREIGN PATENT DOCUMENTS

| | | |
|---|---|---|
| CN | 102201410 A | 9/2011 |
| CN | 103681599 A | 3/2014 |
| CN | 104183599 A | 12/2014 |
| CN | 106992156 A | 7/2017 |
| CN | 108878424 A | 11/2018 |
| CN | 111048467 A | 4/2020 |
| CN | 111463205 A | 7/2020 |

\* cited by examiner

BIT LINE STRUCTURE INCLUDING OHMIC CONTACT AND FORMING METHOD THEREOF

CROSS-REFERENCE TO RELATED APPLICATIONS

This application is a continuation of International patent application No. PCT/CN2021/101424, filed on Jun. 22, 2021, which is filed based upon and claims priority to Chinese patent application No. 202011101808.0, filed on Oct. 15, 2020. The contents of International patent application No. PCT/CN2021/101424 and Chinese patent application No. 202011101808.0 are incorporated herein by reference in their entireties.

TECHNICAL FIELD

The disclosure relates to the technical field of semiconductor devices, and in particular, to a buried bit line and a forming method thereof.

BACKGROUND

With the continuous development of a semiconductor integrated circuit technology, the arrangement density of semiconductor elements in an integrated circuit increases correspondingly, thereby causing a continuously reduced distance between the adjacent semiconductor elements, and directly causing increased stray capacitance between the two adjacent semiconductor elements. A semiconductor memory is used as a widely used semiconductor device, performances of the semiconductor memory is also restricted by the stray capacitance.

Exemplarily, the semiconductor memory includes a plurality of bit lines, and the plurality of bit lines are usually formed on a substrate and arranged in parallel along a predetermined direction. With the continuous reduction in the size of the semiconductor device, the distance size of the adjacent bit lines is gradually reduced, thereby generating greater stray capacitance easily between the adjacent bit lines, and causing a serious delay problem of the memory.

SUMMARY

According to an aspect of the disclosure, a buried bit line is provided, and is formed in a bit line slot in a substrate. The buried bit line includes: a first bit line layer, a first blocking layer and a second bit line layer. The first bit line layer is formed in the bit line slot, and a top of the first bit line layer is lower than a surface of the substrate. The first blocking layer is at least partially formed between the first bit line layer and an inner wall of the bit line slot. The second bit line layer is formed in the bit line slot and configured to communicate the first bit line layer with a drain region in the substrate.

According to another aspect of the disclosure, a forming method for a buried bit line is provided, which includes: forming a first blocking layer on an inner wall of a bit line slot; forming a first bit line layer in the bit line slot, a top of the first bit line layer being lower than a surface of a substrate; and forming a second bit line layer in the bit line slot, the second bit line layer communicating the first bit line layer with a drain region of the substrate.

The details of various embodiments of the disclosure will be described in the drawing and description below. According to the record in the description, drawings and claims, those skilled in the art can easily understand other features, solving problems and beneficial effects of the disclosure.

BRIEF DESCRIPTION OF THE DRAWINGS

To better describe and explain embodiments of the disclosure, one or a plurality of drawings can be referred. However, additional details or examples for describing the drawings shall not be regarded as a limitation to the scope of any one of the disclosure, currently described embodiment or preferred manner of the disclosure.

DETAILED DESCRIPTION

Figure 1:
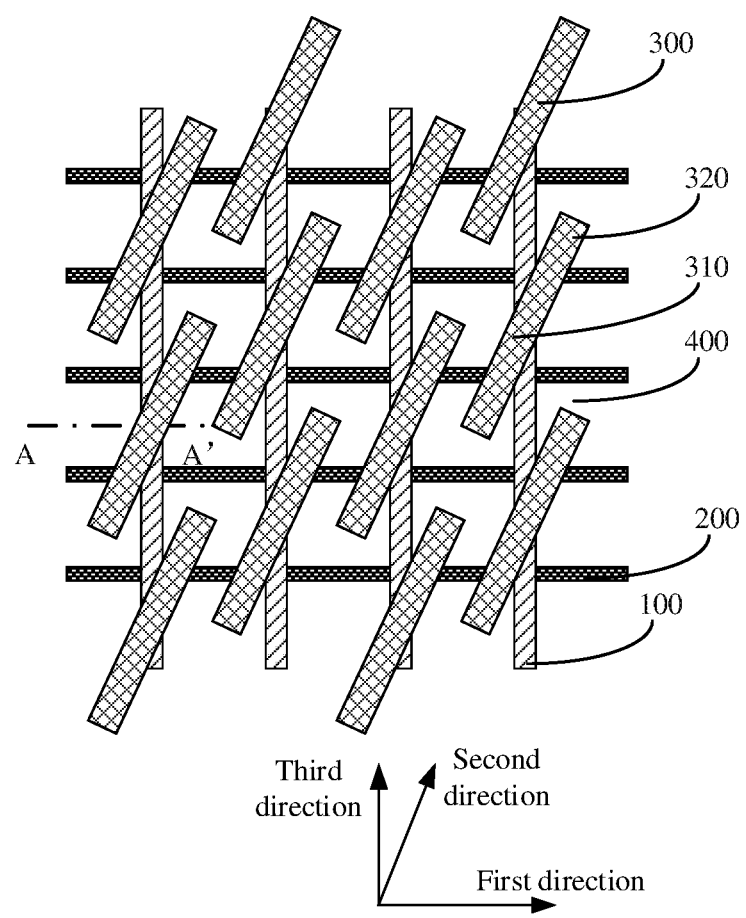
FIG. 1 is a top view of a buried bit line according to an embodiment.

To facilitate the understanding of the disclosure, the disclosure is described completely with reference to the related drawings. The preferred embodiment of the disclosure is given in the drawing. However, the disclosure may be implemented in many different manners, and is not limited to the embodiments described in the disclosure. Conversely, the purpose of providing these embodiments is to enable that the disclosed contents of the disclosure are more thorough and comprehensive.

Unless otherwise defined, the meaning of each of the technical and scientific terms used herein is same as a general meaning understood by those skilled in the art to which the disclosure pertains. The terms used in the description of the disclosure are merely to describe the specific embodiments, rather than to limit the disclosure. The term "and/or" used herein includes any one combination of and all possible combinations of one or more the enumerated items.

In the description of the disclosure, it should be understood that orientation or position relationships indicated by the terms "upper", "lower", "vertical", "horizontal", "inner", and "outer", and the like are based on the orientation or position relationships as illustrated in the drawings, for ease of describing the disclosure and simplifying the description only, rather than indicating or implying that the mentioned apparatus or element necessarily has a particular orientation and must be constructed and operated in the particular orientation. Therefore, these terms should not be understood as limitations to the disclosure.

Figure 2:
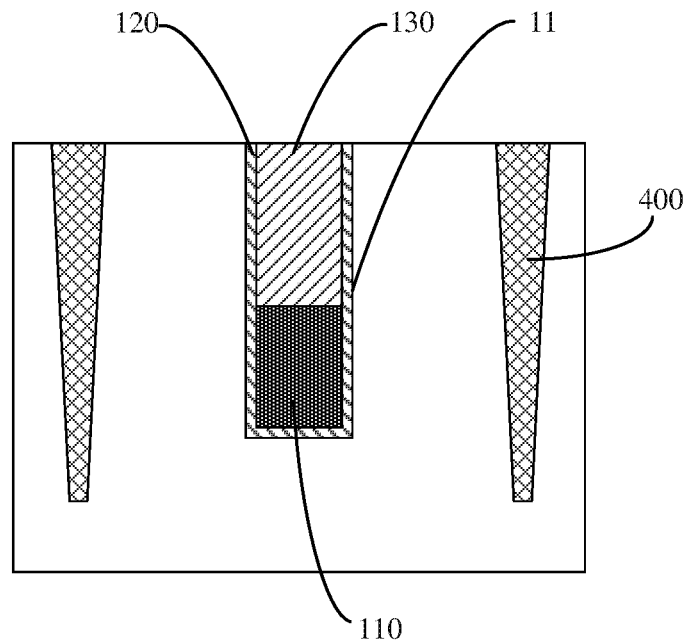
FIG. 2 is a sectional schematic diagram of a buried bit line 100 along an AA' direction according to the embodiment in FIG. 1.

FIG. 1 is a top view of a buried bit line 100 according to an embodiment, and FIG. 2 is a sectional schematic diagram of a buried bit line 100 along an AA' direction according to the embodiment in FIG. 1. To facilitate the illustration, apart from the buried bit line 100, FIG. 1 further shows active regions 300 and word lines 200. Referring to FIG. 1 and FIG. 2, in this embodiment, the active regions 300 and an isolation structure 400 are formed in a substrate.

Herein, the word lines 200 penetrate through a plurality of active regions 300 along a first direction, and divide the active regions 300 into source regions 310 and drain regions 320, and the source regions 310 and the drain regions 320 are arranged along a second direction. Specifically, the adjacent two word lines 200 divide one active region 300 into one drain region 320 and two source regions 310, and one drain region 320 and the two source regions 310 are successively arranged in the second direction according to an order of the source region 310, the drain region 320 and the source region 310. An included angle between the first direction and the second direction is an acute angle, and the acute angle means that the second direction may be coincided with the first direction after the second direction rotates an acute angle less than 90 degrees along a clockwise direction. Exemplarily, the word lines 200 are the buried word lines 200 and include gate dielectric layers, word line 200 metals and buried insulation layers that are successively formed in word line 200 slots. The buried insulation layers cover the gate dielectric layers and the word line 200 metals.

Further, the bit line penetrates through a plurality of active regions 300 along a third direction, and a projection of the bit line in a direction vertical to the substrate and the drain region 320 overlap each other. The third direction is vertical to the first direction. Referring to FIG. 2, in this embodiment, the buried bit line 100 is formed in a bit line slot 11 in the substrate, and the buried bit line 100 includes a first bit line layer 110, a first blocking layer 120 and a second bit line layer 130.

The first bit line layer 110 is formed in the bit line slot 11, and a top of the first bit line layer 110 is lower than a surface of the substrate. Herein, the depth of the bit line slot 11 is 60 nm to 150 nm, and the width of the bit line slot 11 is 10 nm to 60 nm. For example, the depth of the bit line slot 11 may be 100 nm and the width is 30 nm. The height of the first bit line layer 110 is 30 nm to 120 nm, for example 40 nm. The depth of the bit line slot 11 and the height of the first bit line layer 110 refer to a size vertical to a substrate direction, the width of the bit line slot 11 refers to a size parallel to the substrate and vertical to an extension direction of the buried bit line 100, namely the size in the first direction. The first bit line layer 110 is connected/coupled to a bit line contact structure in a peripheral circuit region, thereby reading and writing storage data from an external structure.

The first blocking layer 120 is at least partially formed between the first bit line layer 110 and an inner wall of the bit line slot 11. Herein, the operation that the first blocking layer 120 is at least partially formed between the first bit line layer 110 and the inner wall of the bit line slot 11 means that the first blocking layer 120 may completely cover a plurality of surfaces towards the inner wall of the bit line slot 11 of the first bit line layer 110, and the first blocking layer 120 may further cover part or all of the inner wall of the bit line slot 11.

The second bit line layer 130 is formed in the bit line slot 11 and configured to communicate the first bit line layer 110 with the drain region 320 in the substrate. The second bit line layer 130 completely fills the remaining space in the bit line slot 11, so as to communicate the first bit line layer 110 with the drain region 320 in the substrate. The drain region 320 communicates with the first bit line layer 110 through the second bit line layer 130, and the drain region 320 is conducted or disconnected with the source region 310 under the control a word line 200 signal. When a signal transmission path among the first bit line layer 110, the second bit line layer 130, the drain region 320, the source region 310 and a storage capacitance is conducted, the transmission of storage data may be implemented.

That is, the word lines 200 are connected to gates of transistors in a memory, and configured to control the on/off status of the transistors, namely to control the conduction and disconnecting of a conducting channel between the source region 310 and the drain region 320. The buried bit line 100 is connected to the drain region 320, and the storage capacitance is connected to the source region 310. Specifically, when the transistors are turned on, the corresponding conducting channel is conducted, and the signal is transmitted to the corresponding source region 310 from the drain region 320 or transmitted to the corresponding drain region 320 from the source region 310, thereby implementing the reading and writing of the storage data. When the transistors are turned off, the corresponding conducting channel is disconnected, no signal transmission occurs between the source region 310 and the drain region 320.

According to the generating principles of the stray capacitance, it can be known that increasing a distance between electrode plates or reducing a relative area between the two electrode plates may effectively reduce the stray capacitance under a condition that the size of the two electrode plates forming the stray capacitance is not changed. Moreover, as a determining factor for RC delay of the memory, the stray capacitance directly affects the data transmission performance of the memory.

Therefore, in this embodiment, the distance between the adjacent bit line structures may be effectively increased by arranging the buried bit line 100, thereby effectively reducing the stray capacitance between the two adjacent bit lines and the stray capacitance between the bit line and a capacitance contact structure (cell node contact), and then reducing the overall stray capacitance of the memory and improving the delay problem of data information transmission. Compared with a method for reducing the stray capacitance between metal wires by adopting an air gap or low k material, the buried bit line 100 of this embodiment has a simple technological process and better improvement effect. Moreover, this embodiment may effectively prevent diffusion phenomenon of the material of the first bit line layer 110 by arranging the first blocking layer 120, namely prevent the first bit line layer 110 from being damaged, so as to avoid the problems of reduced conductivity and increased resistance of the first bit line layer 110; and then the RC delay of the buried bit line 100 is further reduced, and the data transmission speed and reliability of the memory are improved.

It should be noted that, in the embodiment as illustrated in FIG. 1, the illustrated buried bit line 100 is of a straight line type structure, and in another embodiment, the buried bit line 100 may also adopt other linear structures, such as a broken line type or a wave type, and the scope of the protection of the disclosure should not be excessively restricted herein.

In an embodiment, the material of the second bit line layer 130 is doped polycrystalline silicone. Doped elements in the doped polycrystalline silicone may include at least one of arsenic (As) or phosphorus (P). In this embodiment, the conductivity of the polycrystalline silicone may be effectively improved through doping As or P in the polycrystalline silicone, so that the resistance of the second bit line layer 130 is reduced, and the problem of RC delay of the memory is improved. Further, the active regions 300 may be enabled to directly contact with the second bit line layer 130 composed of the doped polycrystalline silicone. Through the above arranging manner, the buried bit line 100 of the embodiment may naturally form an ohmic contact on a contact surface of the active regions 300 and the doped polycrystalline silicone. Therefore, no metal silicide layer needs to be additional prepared on the contact surface of the active regions 300 and the second bit line layer 130 to implement the ohmic contact, and less total resistance of the buried bit line 100 is implemented by less technological processes.

Figure 3:
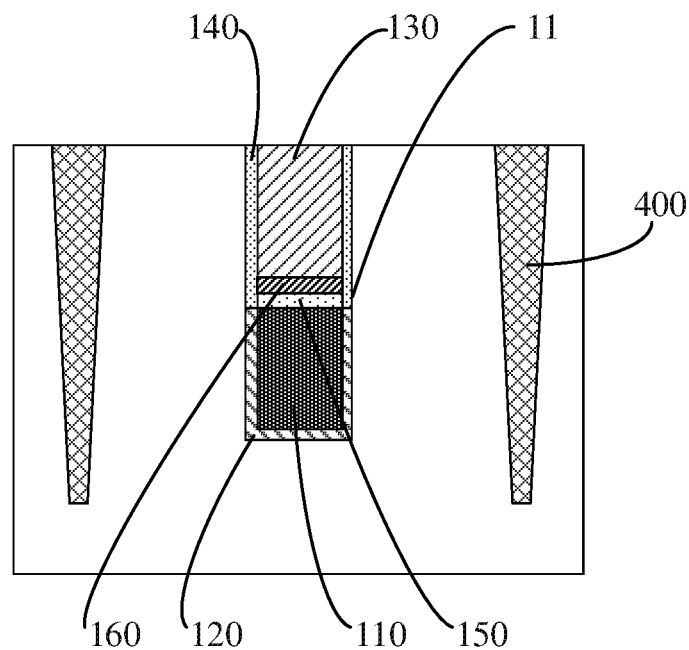
FIG. 3 is a sectional schematic diagram of a buried bit line according to another embodiment.

FIG. 3 is a sectional schematic diagram of a buried bit line 100 according to another embodiment. Referring to FIG. 3, in this embodiment, the top of the first blocking layer 120 is flush with that of the first bit line layer 110. The first blocking layer 120 is configured to electrically isolate the first bit line layer 110 and the active regions 300 so as to prevent the phenomenon such as leakage current and the like and improve the reliability of the memory. When the top of the first blocking layer 120 is flush with that of the first bit line layer 110, the contact area of the second bit line layer 130 may be increased, so that the contact resistance of the second bit line layer 130 is reduced, and then the RC delay of the device is reduced, and the signal transmission speed is improved. Further, the material of the first blocking layer 120 may be at least one of titanium nitride, silicon oxide, silicon oxynitride, titanium-nitride silicide or silicon nitride. The above materials may effectively isolate the first bit line layer 110 and the active regions 300, so as to prevent the materials of the first bit line layer 110 from diffusing, and then the reliability of the first bit line layer 110 is improved.

In an embodiment, still referring to FIG. 3, the buried bit line 100 further includes a second blocking layer 140, and the second blocking layer 140 is at least partially formed between the second bit line layer 130 and the inner wall of the bit line slot 11. Herein, the second blocking layer 140 formed between the second bit line layer 130 and the substrate may prevent the doped elements in the second bit line layer 130 from diffusing to the active regions 300, for example, prevent the arsenic or phosphorus from diffusing to the active regions 300, so as to avoid reducing the doped concentration in the doped polycrystalline silicone, and preventing the conductivity of the doped polycrystalline silicone from reducing.

In an embodiment, still referring to FIG. 3, the buried bit line 100 further includes a third blocking layer 160. The third blocking layer 160 is formed between the second bit line layer 130 and the first bit line layer 110. The third blocking layer 160 formed between the second bit line layer 130 and the first bit line layer 110 may reduce the contact resistance between the metal materials in coatings such as the first bit line layer 110 and the like and the polycrystalline silicone, so that the performance of the memory is further improved. In an embodiment, the material of the second blocking layer 140 is cobalt silicide or titanium silicide.

In some embodiments, the material of the second blocking layer 140 may be the same as that of the third blocking layer 160. If the material of the second blocking layer 140 is the same as that of the third blocking layer 160, the second blocking layer 140 and the third blocking layer 160 may be prepared by the same technological process so as to improve the preparation efficiency of the device. In other embodiments, the material of the second blocking layer 140 may be different from that of the third blocking layer 160, specifically, two coatings needed to be blocked by the second blocking layer 140 are respectively the second bit line layer 130 and the substrate, and the coatings needed to be blocked by the third blocking layer 160 are respectively the first bit line layer 110 and the second bit line layer 130. It should be understood that different materials have different blocking requirements; therefore, the corresponding blocking layer material may be selected according to the material of the two coatings needed to be blocked, a better blocking effect is acquired, and an electric performance of the device is improved.

In an embodiment, still referring to FIG. 3, a contact metal layer 150 is formed between the third blocking layer 160 and the first bit line layer 110, and the contact metal layer 150 and the third blocking layer 160 form an ohmic contact to reduce the contact resistance of the bit line. Exemplarily, the material of the contact metal layer 150 may be cobalt so as to form the ohmic contact with the second blocking layer 140 taking the cobalt silicide as the material. Another exemplarily, the material of the contact metal layer 150 may be titanium so as to form the ohmic contact with the second blocking layer 140 taking the titanium silicide as the material. The embodiment may further improve the contact performance by causing the contact metal layer 150 and the third blocking layer 160 to form the ohmic contact, thereby reducing the RC delay of the memory.

Figure 4:
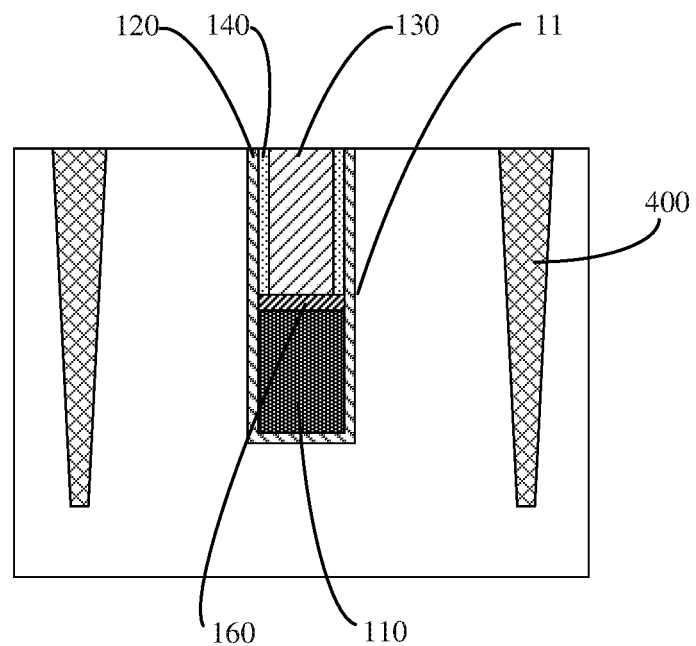
FIG. 4 is a sectional schematic diagram of a buried bit line according to another embodiment.

FIG. 4 is a sectional schematic diagram of a buried bit line 100 according to another embodiment. Referring to FIG. 4, in this embodiment, the second blocking layer 140 is at least partially formed between the second bit line layer 130 and the first blocking layer 120, and the top of the first blocking layer 120 and the top of the second blocking layer 140 are flush with the surface of the substrate. The second blocking layer 140 covers the inner wall of the first blocking layer 120. If the third blocking layer 160 is formed on the surface of the first bit line layer 110, the second blocking layer 140 is formed on the surface of the third blocking layer 160 and covers the inner wall of the first blocking layer 120. Exemplarily, the material of the second bit line layer 130 is doped polycrystalline silicone, the material of the second blocking layer 140 is titanium nitride, and the material of the first blocking layer 120 is silicon nitride. Based on the structure of this embodiment, the second blocking layer 140 and the first blocking layer 120 are successively covered outside the second bit line layer 130. Therefore the second bit line layer 130 and the substrate may be electrically isolated, and a better blocking effect is acquired.

Further, a bit line contact structure needs to be connected at a tail end of each buried bit line 100, so as to acquire a bit line signal from outside. During a design process, a center of the bit line contact structure needs to be flush with an axis of symmetry of the second bit line layer 130 that is parallel to an extension direction of the second bit line layer 130, so that the contact area between a contact structure and the second bit line layer 130 is increased, and the contact resistance between the contact structure and the second bit line layer 130 is reduced. It should be understood that, in an actual preparation process, the contact structure cannot be ensured to be completely flush with the second bit line layer 130, so that the problem of reduced performance of the memory is easily caused. In this embodiment, even a position offset phenomenon occurs during an etching process forming the contact structure, the first blocking layer 120 and the second blocking layer 140 are not damaged during the etching process through arranging the first blocking layer 120 and the second blocking layer 140 that have different etching performances with the second bit line layer 130. That is, the difference between the area and position of a contact window and a design value is effectively reduced, and then an abnormal contact between the contact structure and the second bit line layer 130 is prevented. Therefore, the buried bit line 100 of the embodiment may improve a process window for forming the contact structure, more accurately forms the buried bit line 100 and the contact structure, improves the reliability and accuracy of the memory, and improves the running speed of the memory.

Figure 5:
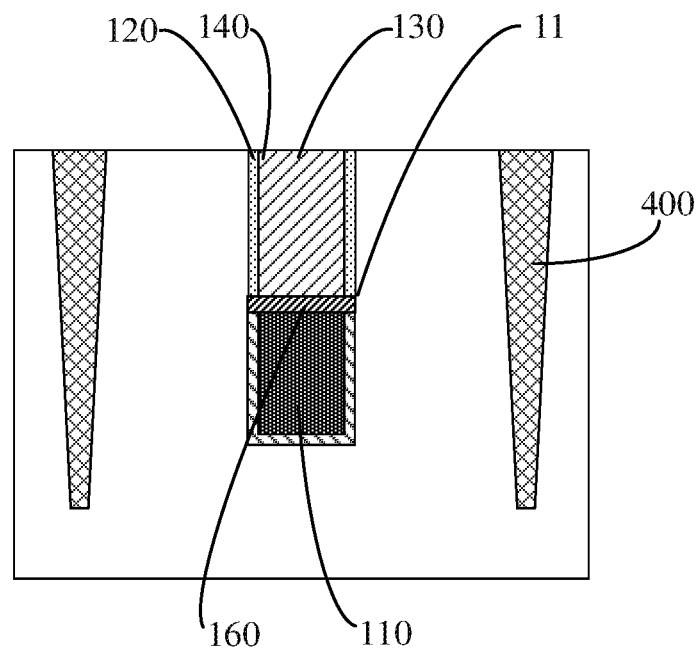
FIG. 5 is a sectional schematic diagram of a buried bit line according to another embodiment.

FIG. 5 is a sectional schematic diagram of a buried bit line 100 according to another embodiment. Referring to FIG. 5, in this embodiment, the third blocking layer 160 covers the first bit line layer 110 and the top of the first blocking layer 120, the second bit line layer 130 and the second blocking layer 140 are formed on the surface of the third blocking layer 160, and the top of the second bit line layer 130 and the top of the second blocking layer 140 are flush with the surface of the substrate. In this embodiment, the third blocking layer 160 is not only configured to space/separate the first bit line layer 110 and the second bit line layer 130, but also to space the first blocking layer 120 and the second blocking layer 140, so as to acquire a better device performance. It should be noted that FIG. 2 to FIG. 5 provide a plurality of different embodiments, however, the illustrated embodiments are only for auxiliary illustration instead of specifically limiting the scope of protection of the disclosure, and other embodiments with the same concept as the disclosure fall in the scope of protection of the disclosure.

Figure 6:
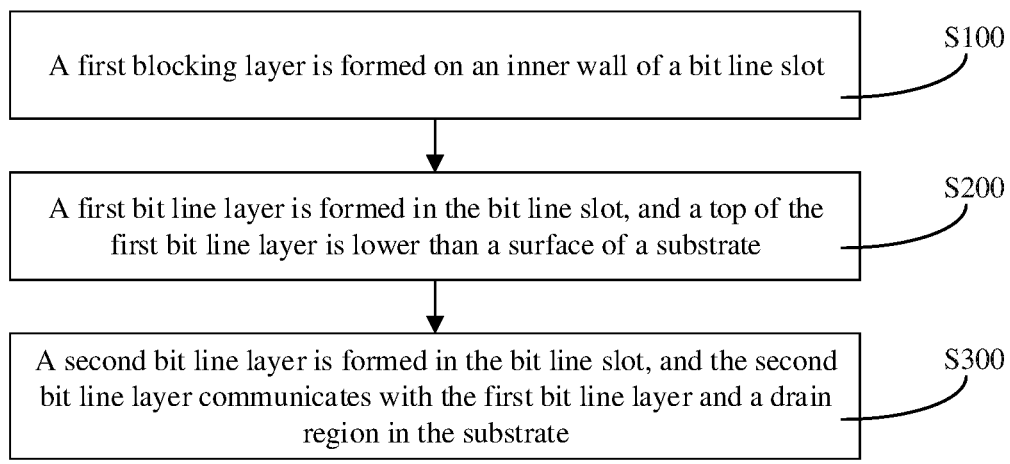
FIG. 6 is a flowchart of a forming method for a buried bit line according to the embodiment in FIG. 2.

FIG. 6 is a flowchart of a forming method for a buried bit line 100 according to the embodiment in FIG. 2. Referring to FIG. 6, the forming method for the buried bit line 100 of this embodiment includes operations S100 to S300.

At S100, a first blocking layer 120 is formed on an inner wall of a bit line slot 11. Specifically, the first blocking layer 120 may be formed on the inner wall of the bit line slot 11 by adopting an atomic layer deposition (ALD). The material of the first blocking layer 120 may be titanium nitride or titanium-nitride silicide. According to the performance requirements of the process and the device, the thickness of the first blocking layer 120 may be 3 nm to 8 nm, for example, the first blocking layer 120 may be titanium nitride with the thickness of 5 nm.

At S200, a first bit line layer 110 is formed in the bit line slot 11, and a top of the first bit line layer 110 is lower than a surface of a substrate. Herein, the depth of the bit line slot 11 is 60 nm to 150 nm, the width of the bit line slot 11 is 10 nm to 60 nm, for example, the depth of the bit line slot 11 may be 100 nm and the width may be 30 nm. The height of the first bit line layer 110 is 30 nm to 120 nm, for example 40 nm. That is, the top of the first bit line layer 110 is lower than the surface of the substrate.

At S300, a second bit line layer 130 is formed in the bit line slot 11, and the second bit line layer 130 communicates the first bit line layer 110 with a drain region 320 in the substrate.

Figure 7:
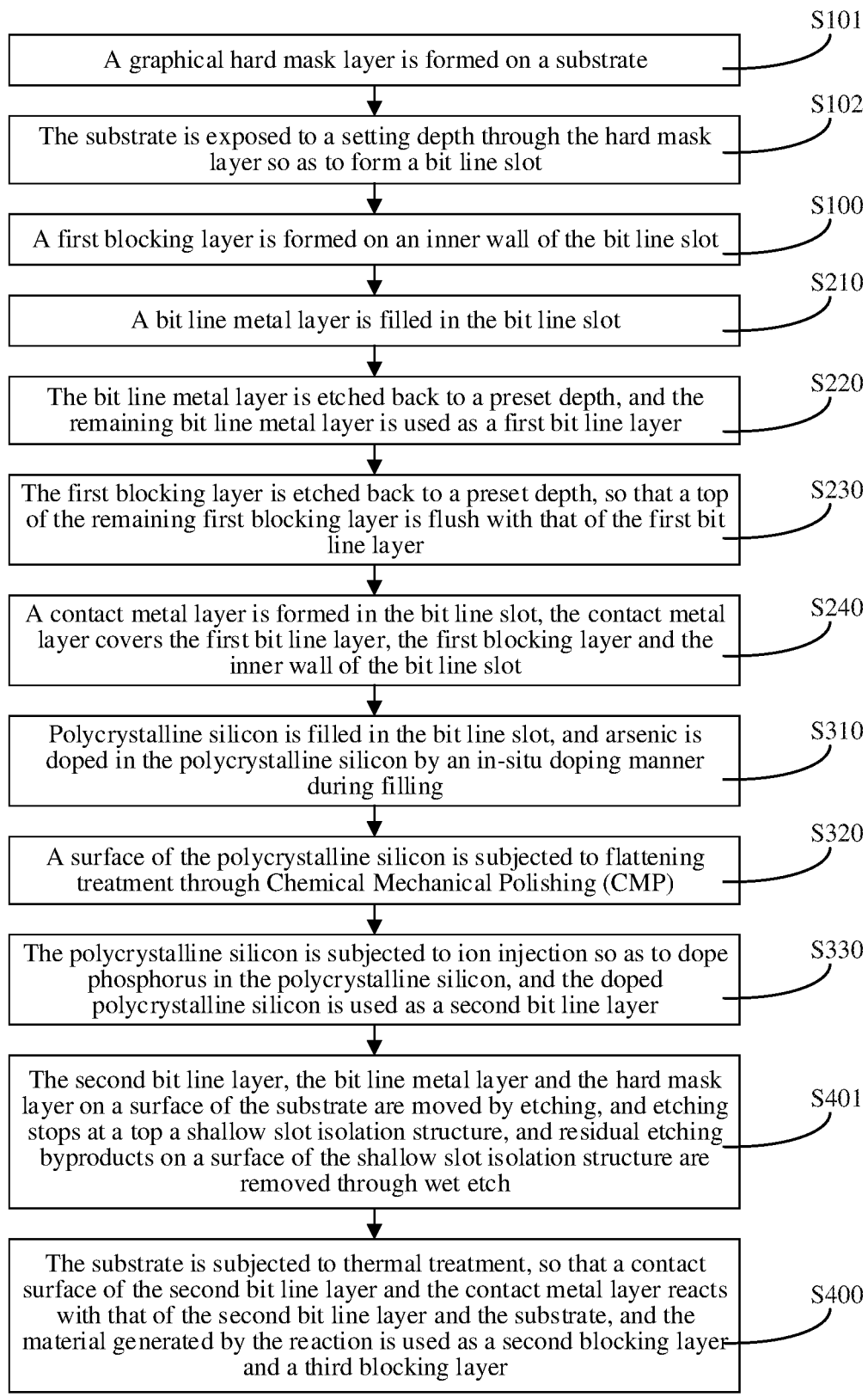
FIG. 7 is a flowchart of a forming method for a buried bit line according to the embodiment in FIG. 3.

FIG. 7 is a flowchart of a forming method for a buried bit line 100 according to the embodiment in FIG. 3. Referring to FIG. 7, in an embodiment, the embodiment includes operations S101 to S102 before operation S100.

Figure 8:
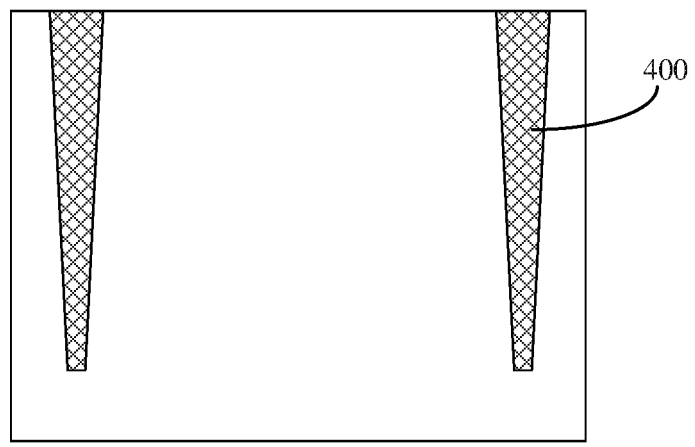
FIG. 8 is a sectional schematic diagram of a substrate provided before operation S101.
Figure 9:
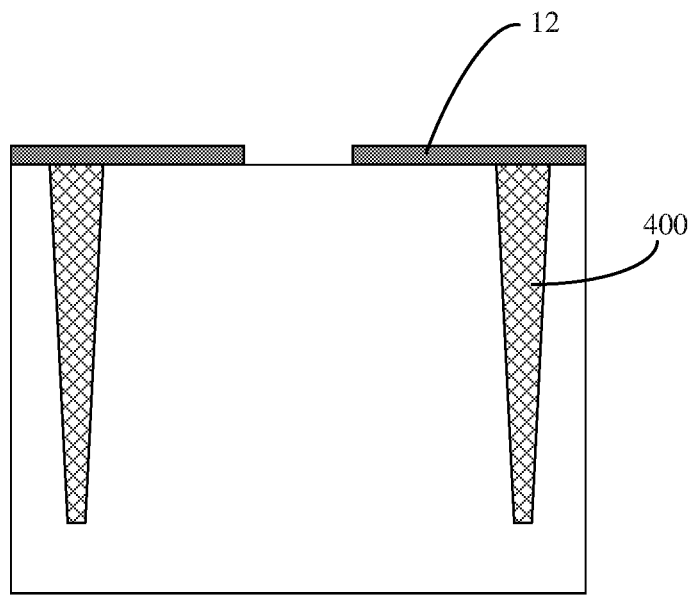
FIG. 9 is a sectional schematic diagram of a buried bit line after operation S101.

At S101, a graphical hard mask layer 12 is formed on the substrate. Specifically, FIG. 8 is a sectional schematic diagram of a substrate provided before operation S101, FIG. 9 is a sectional schematic diagram of a buried bit line 100 after operation S101, and the material of the hard mask layer 12 may be silicon nitride. Referring to FIG. 9, the hard mask layer 12 is etched so as to form an opening on the hard mask layer 12, the opening exposes partial surface of the substrate along a direction vertical to the substrate, and the shape and position of the opening match with those of the bit line slot 11 to be formed.

Figure 10:
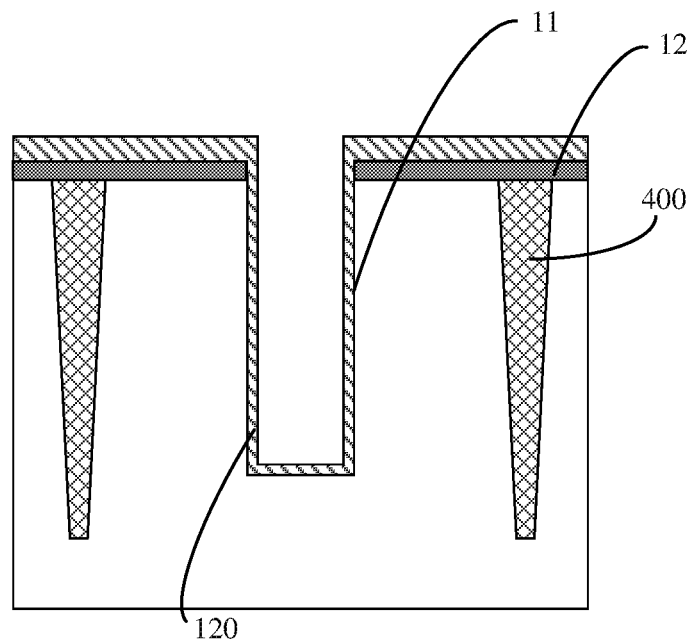
FIG. 10 is a sectional schematic diagram of a buried bit line after operation S102.

At S102, the substrate is exposed to a setting depth through the hard mask layer 12 so as to form the bit line slot 11. Specifically, FIG. 10 is a sectional schematic diagram of a buried bit line 100 after operation S102, and the bit line slot 11 may be formed through a dry etch process or a wet etch process. According to the process and device requirements, the depth of the bit line slot 11 is 60 nm to 150 nm, and the width of the bit line slot 11 is 10 nm to 60 nm.

In an embodiment, operation S200 includes operations S210 to S220.

Figure 11:
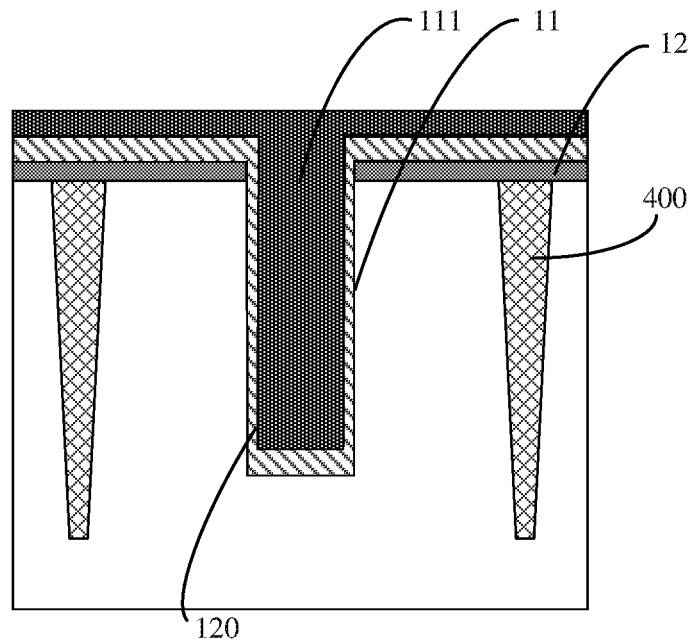
FIG. 11 is a sectional schematic diagram of a buried bit line after operation S210.

At S210, a bit line metal layer 111 is filled in the bit line slot 11. Specifically, FIG. 11 is a sectional schematic diagram of a buried bit line 100 after operation S210. The bit line metal layer 111 may be formed through CVD, and a top of the bit line metal layer 111 is higher than the surface of the substrate, so that the bit line metal layer 111 completely fills the bit line slot 11. After forming the bit line metal layer 111, the substrate may be subjected to chemical mechanical polishing (CMP) treatment so as to improve the surface flatness of the bit line metal layer 111, and a more accurate etching depth is acquired in the next etching operation. The material of the bit line metal layer 111 may be, for example, tungsten.

At S220, the bit line metal layer 111 is etched back to a preset depth, and the remaining bit line metal layer 111 is used as the first bit line layer 110. Specifically, the bit line metal layer 111 may be etched back to the preset depth through dry etch, moreover, when the bit line metal layer 111 is etched, the first blocking layer 120 on the substrate surface may be removed at the same time. Further, 30 nm to 120 nm of bit line metal layer 111 may be etched back downwards from the substrate surface, so as to form the first bit line layer 110.

In an embodiment, before forming the second bit line layer 130 in the bit line slot 11, operation S300 further includes as follows.

Figure 12:
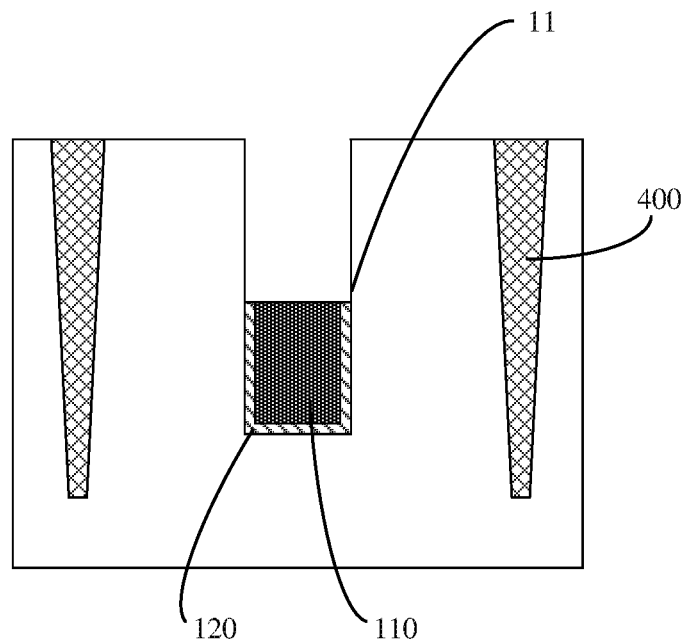
FIG. 12 is a sectional schematic diagram of a buried bit line after operation S230.

At S230, the first blocking layer 120 is etched back to a preset depth, so that a top of the remaining first blocking layer 120 is flush with that of the first bit line layer 110. Specifically, FIG. 12 is a sectional schematic diagram of a buried bit line 100 after operation S230, partial first blocking layer 120 on the inner wall of the bit line slot 11 after operation S220 may be removed through wet etch, and the first blocking layer 120 that is as high as the first bit line layer 110 is kept.

In an embodiment, before forming the second bit line layer 130 in the bit line slot 11, operation S300 further includes as follows.

Figure 13:
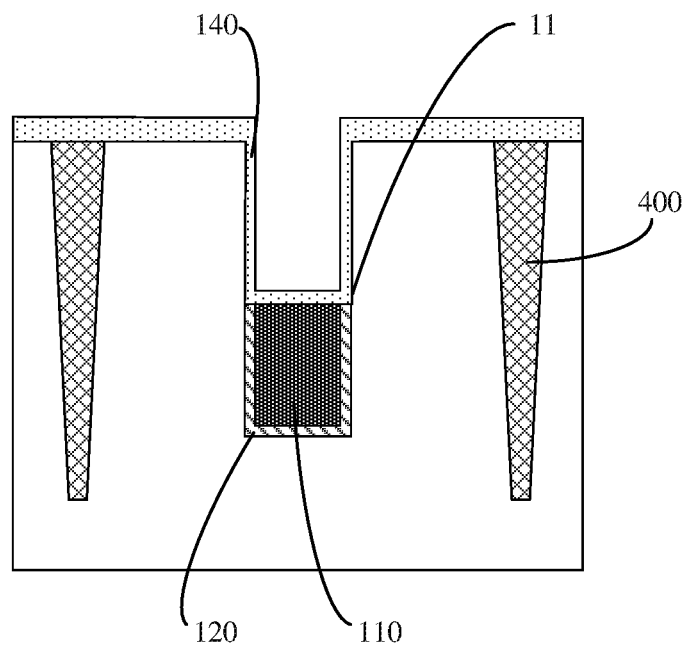
FIG. 13 is a sectional schematic diagram of a buried bit line after operation S240.

At S240, a contact metal layer 150 is formed in the bit line slot 11, the contact metal layer 150 covers the first bit line layer 110, the first blocking layer 120 and the inner wall of the bit line slot 11. Specifically, FIG. 13 is a sectional schematic diagram of a buried bit line 100 after operation S240. That the contact metal layer 150 is formed in the bit line slot 11 includes that titanium or cobalt is formed on the inner wall of the bit line slot 11, that is, the material of the contact metal layer 150 may be titanium or cobalt. Further, the titanium or cobalt may be formed on the inner wall of the bit line slot 11 by adopting physical vapor deposition (PVD). In an embodiment, operation S300 includes operations S310 to S330.

At S310, polycrystalline silicon is filled in the bit line slot 11, and arsenic is doped in the polycrystalline silicon by an in-situ doping manner during filling. Specifically, the polycrystalline silicon may be deposited in the bit line slot 11 by adopting CVD.

At S320, a surface of the polycrystalline silicon is subjected to flattening treatment through CMP.

Figure 14:
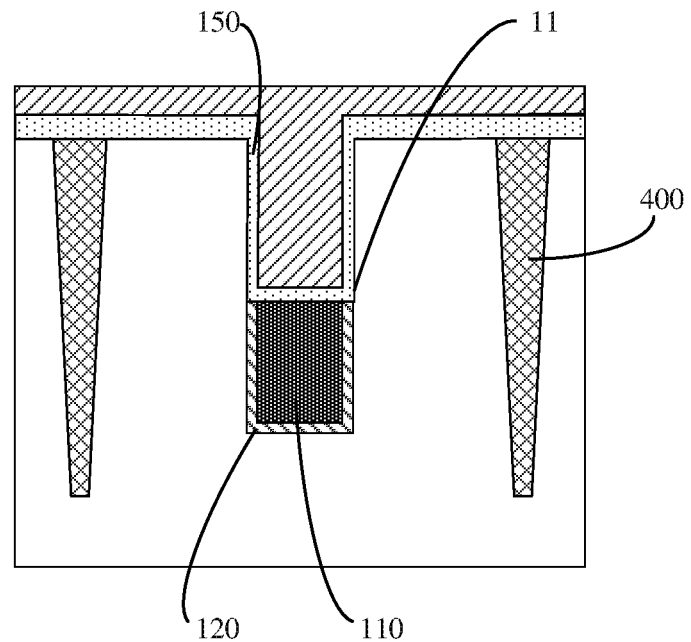
FIG. 14 is a sectional schematic diagram of a buried bit line after operation S330.

At S330, the polycrystalline silicon is subjected to ion injection so as to dope phosphorus in the polycrystalline silicon, and the doped polycrystalline silicon is used as the second bit line layer 130. Specifically, FIG. 14 is a sectional schematic diagram of a buried bit line 100 after operation S330.

After forming the second bit line layer 130 in the bit line slot 11, operation S300 further includes as follows.

At S400, the substrate is subjected to thermal treatment, so that a contact surface of the second bit line layer 130 and the contact metal layer 150 reacts with that of the second bit line layer 130 and the substrate to generate a second blocking layer 140 and a third blocking layer 160. That is, the sectional schematic diagram of the buried bit line 100 as illustrated in FIG. 3 is formed.

Figure 15:
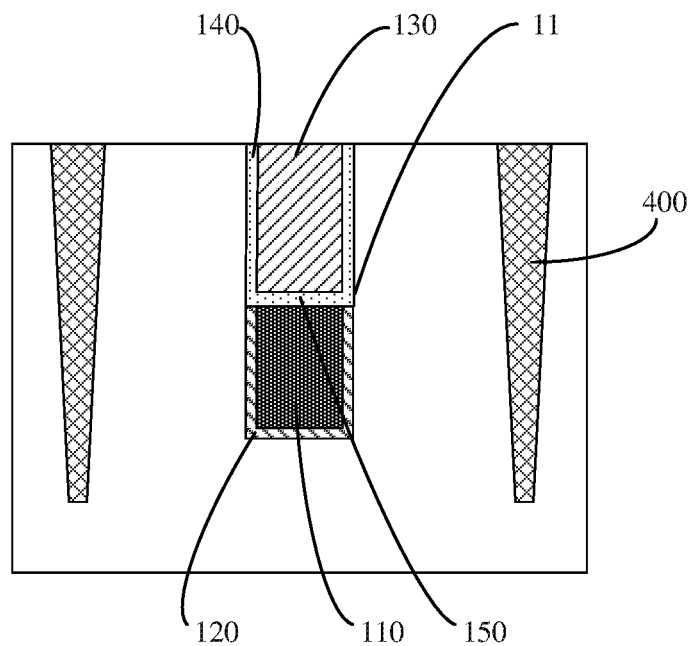
FIG. 15 is a sectional schematic diagram of a buried bit line after operation S401.

In an embodiment, before operation S400, the embodiment further includes operation S401: the second bit line layer 130, the bit line metal layer 111 and the hard mask layer 12 on the surface of the substrate are moved by etching, and etching stops at a top a shallow slot isolation structure 400, and residual etching byproducts on the surface of the shallow slot isolation structure are removed through wet etch. Specifically, FIG. 15 is a sectional schematic diagram of a buried bit line 100 after operation S401.

Figure 16:
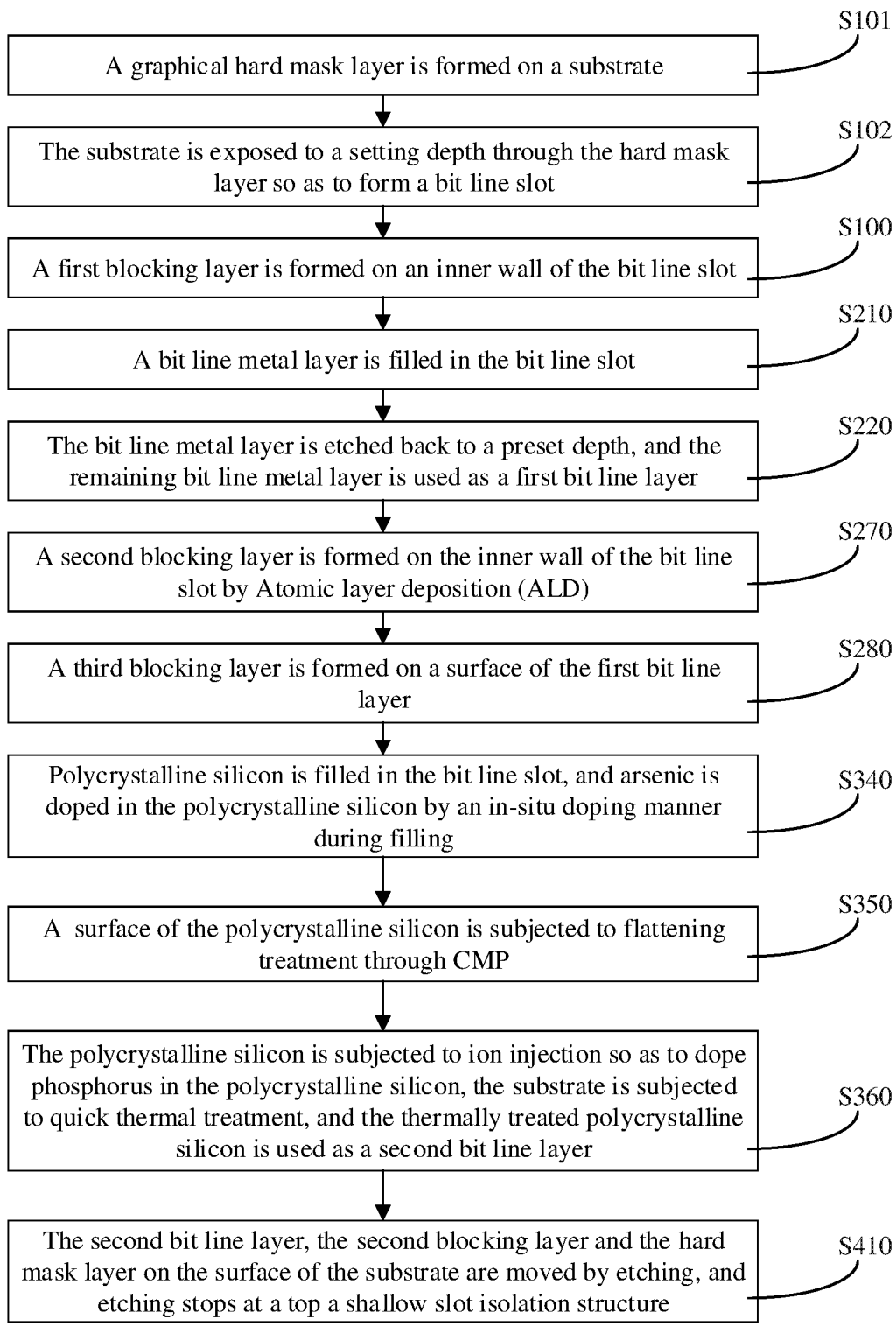
FIG. 16 is a flowchart of a forming method for a buried bit line according to the embodiment in FIG. 4.

FIG. 16 is flowchart of a forming method for a buried bit line 100 according to the embodiment in FIG. 4. Referring to FIG. 16, in this embodiment, similar to the embodiment in FIG. 7, before operation S100, this embodiment further includes operations S101 and S102.

At S101, a graphical hard mask layer 12 is formed on the substrate. Specifically, the material of the hard mask layer 12 may be silicon nitride, the hard mask layer 12 is etched so as to form an opening on the hard mask layer 12, the opening exposes partial surface of the substrate along a direction vertical to the substrate, and the shape and position of the opening match with those of the bit line slot 11 to be formed.

At S102, the substrate is exposed to a setting depth through the hard mask layer 12 so as to form the bit line slot 11. Specifically, the bit line slot 11 may be formed through a dry etch process or a wet etch process. According to the process and device requirements, the depth of the bit line slot 11 is 60 nm to 150 nm, and the width of the bit line slot 11 is 10 nm to 60 nm.

In an embodiment, operation S100 includes: the first blocking layer 120 is formed on the surface of a slot by adopting ALD. Specifically, the material of the first blocking layer 120 may be, for example, at least one of silicon nitride, silicon oxide or silicon oxynitride. Further, according to the performance requirements of the process and device, the thickness of the first blocking layer 120 is 2 nm to 10 nm, for example, 5 nm.

In an embodiment, operation S200 includes operations S210 to S220.

At S210, a bit line metal layer 111 is filled in the bit line slot 11. Specifically, the bit line metal layer 111 may be formed through CVD, and a top of the bit line metal layer 111 is higher than the surface of the substrate, so that the bit line metal layer 111 completely fills the bit line slot 11. After forming the bit line metal layer 111, the substrate may be subjected to CMP treatment so as to improve the surface flatness of the bit line metal layer 111, and a more accurate etching depth is acquired in the next etching operation. The material of the bit line metal layer 111 may be, for example, tungsten.

At S220, the bit line metal layer 111 is etched back to a preset depth, and the remaining bit line metal layer 111 is used as the first bit line layer 110.

Figure 17:
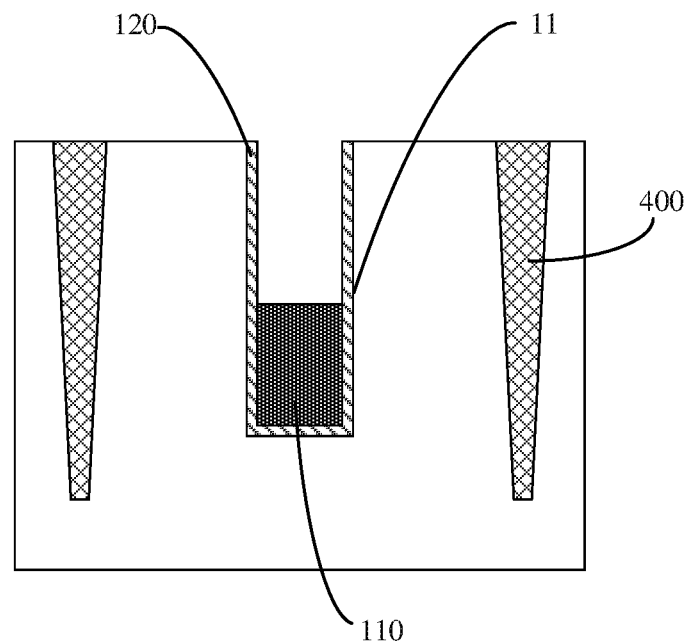
FIG. 17 is a sectional schematic diagram of a buried bit line after operation S220.

Specifically, the sectional schematic diagram of the buried bit line 100 after operations S101 to S210 may refer to FIG. 9-FIG. 11 correspondingly, and the sectional schematic diagram of the buried bit line 100 after operation S220 may refer to FIG. 17.

In an embodiment, before operation S300, the embodiment further includes operation S270.

Figure 18:
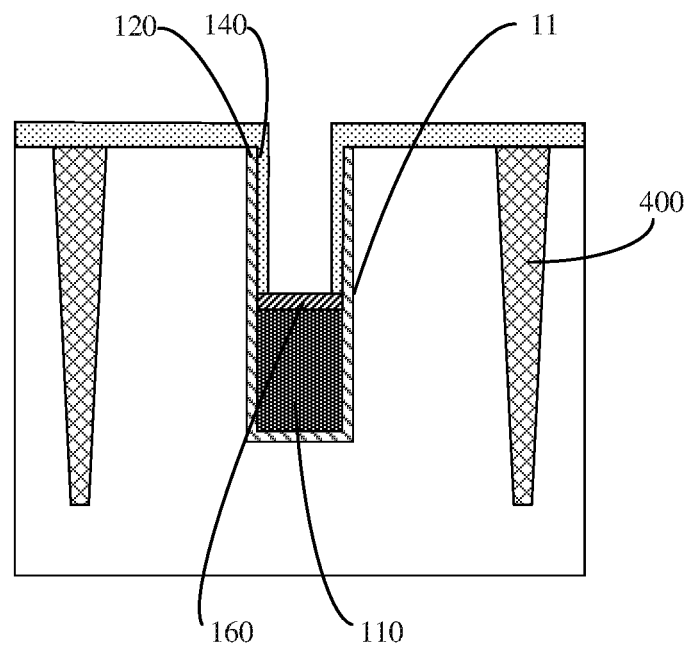
FIG. 18 is a sectional schematic diagram of a buried bit line after operation S270.

At S270, a second blocking layer 140 is formed on the inner wall of the bit line slot 11 by ALD. Specifically, FIG. 18 is a sectional schematic diagram of a buried bit line 100 after operation S270. The material of the second blocking layer 140 may be titanium nitride or titanium-nitride silicide. According to the performance requirements of the process and the device, the thickness of the second blocking layer 140 may be 2 nm to 8 nm, for example, the second blocking layer 140 may be titanium nitride with the thickness of 5 nm. The second blocking layer 140 is formed on the surface of the first blocking layer 120

At S280, a third blocking layer 160 is formed on the surface of the first bit line layer 110.

Further, if the second blocking layer 140 has the same material with that of the third blocking layer 160, the second blocking layer 140 and the third blocking layer 160 may be prepared by the same technological process, that is, operations S270 and S280 are implemented at the same time so as to reduce the quantity of the technological process and improve the preparation efficiency of the device. For example, the second blocking layer 140 may be formed on the inner wall of the bit line slot 11 by adopting ALD while the third blocking layer 160 is formed on the surface of the first bit line layer 110.

Furthermore, if the second blocking layer 140 has the same material as that of the third blocking layer 160, the second blocking layer 140 and the third blocking layer 160 may be formed in steps. Moreover, this embodiment does not specifically limit the preparation order of the second blocking layer 140 and the third blocking layer 160, namely not specifically limit to prepare the second blocking layer 140 firstly or prepare the third blocking layer 160 firstly. Exemplarily, the third blocking layer 160 may be formed on the surface of the first bit line layer 110 firstly, and then the second blocking layer 140 is formed on the surface of the first blocking layer 120.

In an embodiment, operation S300 includes operations S340 to S360.

At S340, polycrystalline silicon is filled in the bit line slot 11, and arsenic is doped in the polycrystalline silicon by an in-situ doping manner during filling. Specifically, the polycrystalline silicon may be deposited in the bit line slot 11 by adopting CVD.

At S350, a surface of the polycrystalline silicon is subjected to flattening treatment through CMP.

Figure 19:
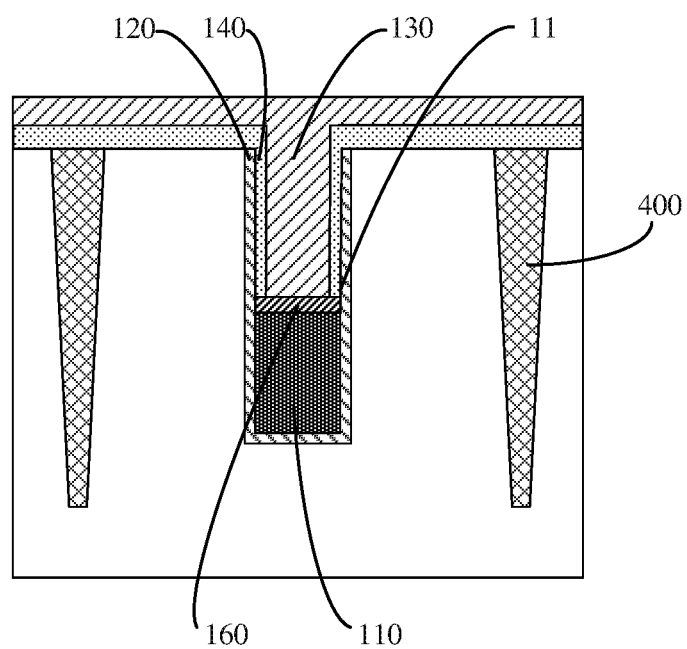
FIG. 19 is a sectional schematic diagram of a buried bit line after operation S360.

At S360, the polycrystalline silicon is subjected to ion injection so as to dope phosphorus in the polycrystalline silicon, the substrate is subjected to quick thermal treatment, and the thermally treated polycrystalline silicon is used as the second bit line layer 130. Specifically, FIG. 19 is a sectional schematic diagram of a buried bit line 100 after operation S360.

In an embodiment, after operation S300, the embodiment further includes operation S410: the second bit line layer 130, the second blocking layer 140, the first blocking layer 120 and the hard mask layer 12 on the surface of the substrate are moved by etching, and etching stops at a top a shallow slot isolation structure 400.

It should be noted that the buried bit line 100 prepared by the methods and embodiments in FIG. 6, FIG. 7 and FIG. 16 corresponds to the structure of the product embodiment of the foregoing buried bit line 100, and each coating structure has the same action and product, and details are not described in the method embodiments.

It should be understood that, although various operations in the flowcharts of FIG. 6, FIG. 7 and FIG. 16 are successively displayed according to the indication of an arrow, those operations are not necessarily implemented according to the order indicated by the arrow. Unless otherwise specified herein, the implementation of those operations is not strictly limited by the order, and those operations may be implemented in other orders. Moreover, at least partial operations of FIG. 6, FIG. 7 and FIG. 16 may include a plurality of sub-operations or a plurality of stages, these sub-operations or stages are not necessarily implemented or completed at the same time, and may be implemented at different times. The implementation order of these sub-operations or stages are not necessarily performed successively, but implemented in turns or alternately with other operations or the sub-operations or stages of other operations.

The technical features of the above embodiments may be combined freely. In order to describe briefly, the descriptions are not made on all possible combinations of the technical features of the embodiments. However, the combinations of these technical features should be construed as falling into a scope of the description as long as there is no conflict in these combinations.

The above embodiments only describe several implementation modes of the disclosure. The description is specific and detailed, but cannot be understood as limitations to a scope of the disclosure. It is noted that those of ordinary skill in the art can further make multiple modifications and improvements without departing from a concept of the disclosure and those also belong to the protection scope of the disclosure. Therefore, the protection scope of the disclosure shall only be limited by the appended claims.

The invention claimed is:

1. A buried bit line, formed in a bit line slot in a substrate, comprising:
   a first bit line layer, formed in the bit line slot, wherein a top of the first bit line layer is lower than a surface of the substrate;
   a first blocking layer, at least partially formed between the first bit line layer and an inner wall of the bit line slot;
   a second bit line layer, formed in the bit line slot and configured to communicate the first bit line layer with a drain region in the substrate;
   a second blocking layer, at least partially formed between the second bit line layer and the inner wall of the bit line slot; and
   a third blocking layer, formed between the second bit line layer and the first bit line layer;
   wherein a contact metal layer is formed between the third blocking layer and the first bit line layer, and the contact metal layer and the third blocking layer form an ohmic contact.

2. The buried bit line of claim 1, wherein a top of the first blocking layer is flush with the top of the first bit line layer.

3. The buried bit line of claim 1, wherein the second blocking layer and the third blocking layer have same materials.

4. A forming method for a buried bit line, comprising:
   forming a first blocking layer on an inner wall of a bit line slot;
   forming a first bit line layer in the bit line slot, wherein a top of the first bit line layer is lower than a surface of a substrate;
   forming a contact metal layer in the bit line slot, wherein the contact metal layer covers the first bit line layer, the first blocking layer and the inner wall of the bit line slot;
   forming a second bit line layer in the bit line slot, wherein the second bit line layer communicates the first bit line layer with a drain region in the substrate; and
   performing a thermal treatment on the substrate, so that a contact surface of the second bit line layer and the contact metal layer reacts with a contact surface of the second bit line layer and the substrate to generate a second blocking layer and a third blocking layer;
   wherein the contact metal layer is formed between the third blocking layer and the first bit line layer, and the contact metal layer and the third blocking layer form an ohmic contact.

5. The forming method for the buried bit line of claim 4, wherein before forming the contact metal layer in the bit line slot, the method further comprises:
   etching the first blocking layer back to a preset depth, so that a top of the remaining first blocking layer is flush with the top of the first bit line layer.

6. The forming method for the buried bit line of claim 4, wherein the first bit line layer being formed in the bit line slot and the top of the first bit line layer being lower than the surface of the substrate comprises:
   filling a bit line metal layer in the bit line slot; and
   etching the bit line metal layer back to a preset depth, wherein the remaining bit line metal layer is used as the first bit line layer.

\* \* \* \* \*